United States Patent
Kuwayama (12) 
(10) Patent No.: US 6,353,916 B1
(45) Date of Patent: Mar. 5, 2002

(54) TIMING ANALYSIS METHOD FOR USE IN VERIFICATION OF OPERATING SPEED OF SEMICONDUCTOR INTEGRATED CIRCUITS

(75) Inventor: Katsumi Kuwayama, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/359,659

(22) Filed: Jul. 26, 1999

(30) Foreign Application Priority Data

Jul. 27, 1998 (JP) .......................... 10-211104

(51) Int. Cl.⁷ .............................. G06F 17/50
(52) U.S. Cl. .............................. 716/6; 716/5
(58) Field of Search .......................... 716/5, 6

(56) References Cited

U.S. PATENT DOCUMENTS

| | | | | |
|---|---|---|---|---|
| 5,726,902 A | * | 3/1998 | Mahmood | 716/6 |
| 5,872,717 A | * | 2/1999 | Yu | 716/6 |
| 5,896,299 A | * | 4/1999 | Ginetti | 716/4 |
| 6,128,769 A | * | 10/2000 | Carlson | 716/6 |
| 6,148,434 A | * | 11/2000 | Nozuyama | 716/6 |

* cited by examiner

Primary Examiner—John F. Niebling
Assistant Examiner—Stacy Whitmore
(74) Attorney, Agent, or Firm—Oblon, Spivak, McClelland, Maier & Neustadt, P.C.

(57) ABSTRACT

The timing analysis for semiconductor integrated circuits is mainly made in accordance with the following procedure. First, maximum capacitance and minimum capacitance are determined for each of nodes on a circuit (first step). Static timing analysis is made using the maximum capacitance and the minimum capacitance to determine the timing of paths comprised of one or more of the nodes. The paths are classified into conformable paths in which the timing satisfies a predetermined constraint, nonconformable paths in which the timing does not satisfy the constraint, and undecided paths that belong to neither the conformable paths nor the nonconformable paths (second step). Dynamic timing analysis is made of the undecided paths to classify them in either the conformable paths or the nonconformable paths (third step).

11 Claims, 5 Drawing Sheets

TIMING ANALYSIS METHOD FOR USE IN VERIFICATION OF OPERATING SPEED OF SEMICONDUCTOR INTEGRATED CIRCUITS

BACKGROUND OF THE INVENTION

The present invention relates to a timing analysis method in logic LSI design and more specifically to a timing analysis method used to verify the operating speed of semiconductor integrated circuits.

In recent deep sub-micron generations of LSI semiconductor integrated circuits, the interconnection capacitance has been forming an increasingly important factor in determining the circuit operating speed. Interconnection capacitances are roughly classified into two groups: capacitances between signal nodes through which a signal current flows and power supply or ground and coupling capacitances between signal nodes. In recent years, the fine pattern process has increased the percentage of the node-to-node coupling capacitance relative to the node-to-power supply (ground) capacitance. These capacitances will be described below.

Figure 1:
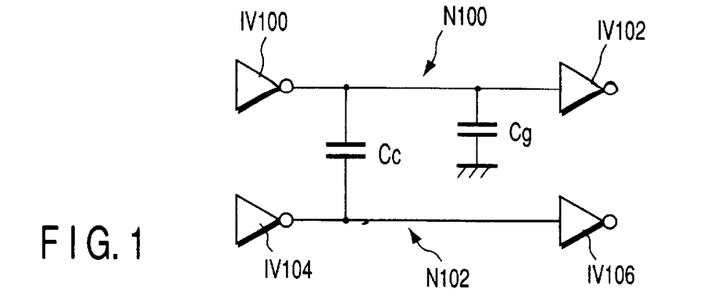
FIG. 1 is a circuit diagram illustrating interconnection capacitance between devices.

FIG. 1 is a circuit diagram illustrating device-to-device interconnection capacitances. A node N100 that interconnects inverters IV100 and IV102 and a node N102 that interconnects inverters IV104 and IV106 are formed in close proximity to each other. In this case, coupling capacitance Cc is present between the nodes N100 and N102. In addition, ground capacitance Cg exists between the node N100 and ground.

As the demand has increased for incorporating a system in its entirety into a single chip, the circuit scale of semiconductor integrated circuits has increased. For this reason, the technique of verifying the performance of chips that are increasing in circuit scale, especially their operating speed, has shifted from dynamic simulation requiring an enormous amount of verification time to static simulation allowing faster processing.

With conventional static timing analysis for semiconductor integrated circuits, it is impossible to compute the delay time associated with a certain node with coupling capacitance present between that node and another node in mind. This is due to the property of the static timing analysis that, at the time of analysis of a certain node, the potential at another node is unknown.

Thus, the static timing analysis is made heretofore in accordance with the following approaches.

Figure 2:
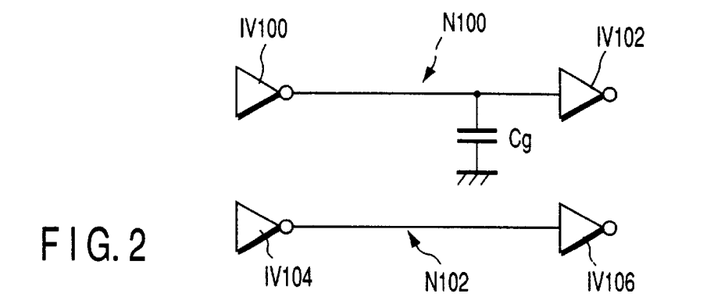
FIG. 2 shows an equivalent circuit illustrating interconnection capacitance when coupling capacitance is neglected.

A first approach is to neglect coupling capacitance. FIG. 2 is an equivalent circuit illustrating inter-device interconnection capacitance when the coupling capacitance is neglected. As shown in FIG. 2, a node N100 that interconnects inverters IV100 and IV102 and a node 102 that interconnects inverters IV104 and IV106 are formed in close proximity to each other. In this case as well, ground capacitance Cg is associated with the node N100 to be analyzed.

Figure 3:
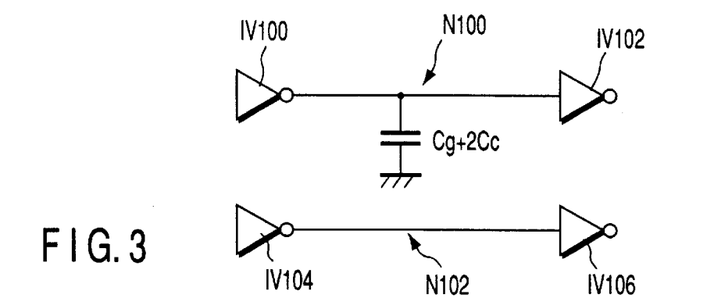
FIG. 3 shows an equivalent circuit illustrating interconnection capacitance when coupling capacitance is doubled and then transformed to ground capacitance.

A second approach is to double the value of coupling capacitance Cc and add it to the ground capacitance. FIG. 3 shows an equivalent circuit in such a case. As shown in FIG. 3, a node N100 that interconnects inverters IV100 and IV102 together and a node 102 that connects inverters IV104 and IV106 together are formed in close proximity to each other. In this case, ground capacitance Cg and capacitance 2Cc twice the coupling capacitance Cc are associated with the node N100 to be analyzed.

Figure 4:
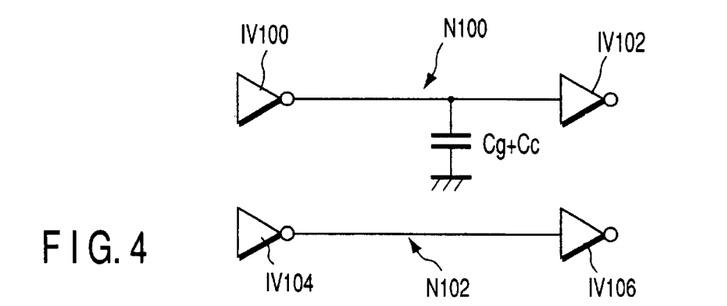
FIG. 4 shows an equivalent circuit illustrating interconnection capacitance when coupling capacitance is transformed to ground capacitance.

A third approach is to convert the coupling capacitance Cc to ground capacitance with its value maintained. FIG. 4 shows an equivalent circuit in such a case. As shown in FIG. 4, a node N100 that interconnects inverters IV100 and IV102 and a node 102 that interconnects inverters IV104 and IV106 are formed in close proximity to each other. In this case, ground capacitance Cg and coupling capacitance Cc are associated with the node N100 to be analyzed.

However, the conventional approaches have the following problems.

Figure 5:
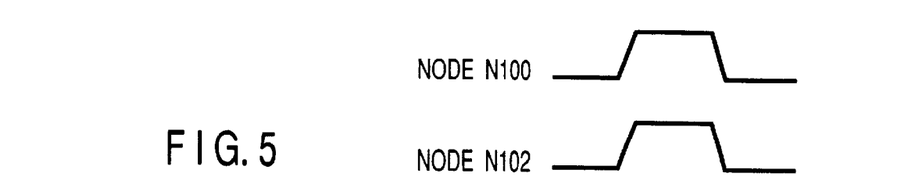
FIG. 5 is a timing diagram illustrating variations in the potential at the nodes in FIG. 2.

In the first approach, the coupling capacitance is neglected. This supposes that, as shown in FIG. 5, the potential at node N102 varies (falls or rises) in the same direction as and simultaneously with the potential at the node N100 to be analyzed. Thus, the calculated delay time becomes less than the actual delay time except when the potentials at the two nodes vary simultaneously in the same direction.

Figure 6:
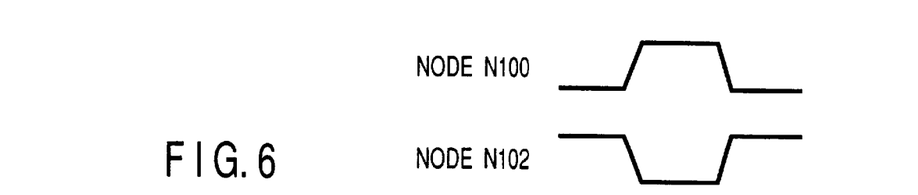
FIG. 6 is a timing diagram illustrating variations in the potential at the nodes in FIG. 3.

In the second approach, the coupling capacitance Cc is doubled and then added to the ground capacitance Cg. This supposes that, as shown in FIG. 6, the potential at node N102 varies (falls or rises) in the opposite direction to and exactly simultaneously with the potential at the node N100 to be analyzed. Thus, except when the potentials at the two nodes vary simultaneously in opposite directions, the calculated delay time becomes more than the actual delay time.

Figure 7:
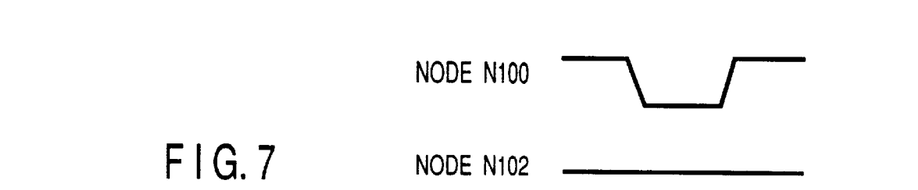
FIG. 7 is a timing diagram illustrating variations in the potential at the nodes in FIG. 4.

In the third approach, the coupling capacitance Cc is added as it is to the ground capacitance Cg. This supposes that, as shown in FIG. 7, the potential at the node N102 is fixed. Thus, except when the potential at the node N102 is fixed, the calculated delay time becomes less than or more than the actual delay time.

That is, the conventional static timing analysis requires additional margin because the effect of the coupling capacitance cannot be reflected precisely. On the other hand, although conditions have been satisfied on static timing analysis, they may sometimes not be satisfied on actual chips.

BRIEF SUMMARY OF THE INVENTION

It is therefore an object of the present invention to provide a fast and precise timing analysis method for semiconductor integrated circuits which permits the effect of coupling capacitance between interconnections to be reflected accurately.

According to a first aspect of the present invention, there is provided a timing analysis method for semiconductor integrated circuits comprising the steps of: determining maximum capacitance and minimum capacitance for each of nodes on a circuit; making static timing analysis, using the maximum capacitance and minimum capacitance, of paths comprising one or more of the nodes on the circuit to classify the paths into conformable paths that satisfy a predetermined constraint, nonconformable paths that do not satisfy the constraint, and undecided paths that belong to neither the conformable paths nor the nonconformable paths; and making dynamic timing analysis of the undecided paths.

With this timing analysis method, the maximum capacitance and minimum capacitance are determined for each node on a circuit. Static timing analysis is first made using the maximum capacitance and minimum capacitance to classify paths into conformable paths that satisfy a predetermined constraint, nonconformable paths that do not satisfy the constraint, and undecided paths that belong to neither the conformable paths nor the nonconformable paths. Dynamic timing analysis is then made of the undecided paths to allow them to fall into either conformable paths or nonconformable paths. The use of the dynamic timing analysis only for the paths that cannot be distinguished by the static timing analysis allows the time required for timing analysis to be reduced and precision analysis to be made.

According to a second aspect of the present invention, there is provided a timing analysis method for semiconductor integrated circuits comprising the steps of: determining maximum capacitance and minimum capacitance for each of nodes on a circuit; making static timing analysis of data nodes that carry data signals and clock nodes that carry clock signals with the maximum capacitance selected for the data nodes and the minimum capacitance selected for the clock nodes; classifying, on the basis of the result of the static timing analysis, paths comprising one or more of the nodes on the circuit into conformable paths that satisfy a setup constraint and undecided paths that do not belong to the conformable paths; and making dynamic timing analysis of the undecided paths.

With this timing analysis method, the maximum capacitance and minimum capacitance are determined for each node on a circuit. Static timing analysis is first made using the maximum capacitance and minimum capacitance to classify paths into conformable paths that satisfy a setup constraint and other paths that cannot be decided by the static timing analysis. Dynamic timing analysis is then made of the undecided paths to allow them to fall into either conformable paths or nonconformable paths. The use of the dynamic timing analysis only for the paths that cannot be distinguished by the static timing analysis allows the time required for timing analysis to be reduced and precision analysis to be made.

According to a third aspect of the present invention, there is provided a timing analysis method for semiconductor integrated circuits comprising the steps of: determining maximum capacitance and minimum capacitance for each of nodes on a circuit; making static timing analysis of data nodes that carry data signals and clock nodes that carry clock signals with the minimum capacitance selected for the data nodes and the maximum capacitance selected for the clock nodes; classifying, on the basis of the result of the static timing analysis, paths comprising one or more of the nodes on the circuit into conformable paths that satisfy a hold constraint and undecided paths that do not belong to the conformable paths; and making dynamic timing analysis of the undecided paths.

With this timing analysis method, the maximum capacitance and minimum capacitance are determined for each node on a circuit. Static timing analysis is first made using the maximum capacitance and minimum capacitance to classify paths into conformable paths that satisfy a hold constraint and other paths that cannot be decided by the static timing analysis. Dynamic timing analysis is then made of the undecided paths to allow them to fall into either conformable paths or nonconformable paths. The use of the dynamic timing analysis only for the paths that cannot be distinguished by the static timing analysis allows the time required for timing analysis to be reduced and precision analysis to be made.

According to a fourth aspect of the present invention, there is provided a timing analysis method for semiconductor integrated circuits comprising the steps of: determining maximum capacitance and minimum capacitance for each of nodes on a circuit; making first static timing analysis of data nodes that carry data signals and clock nodes that carry clock signals with the maximum capacitance selected for the data nodes and the minimum capacitance selected for the clock nodes; making second static timing analysis of the data nodes and the clock nodes with the minimum capacitance selected for the data nodes and the maximum capacitance selected for the clock nodes; classifying paths comprising one or more of the nodes on the circuit into conformable paths that, as the result of the first static timing analysis, satisfy a setup constraint, nonconformable paths that, as the result of the second static timing analysis, do not satisfy the setup constraint, and undecided paths that belong to neither the conformable paths nor the nonconformable paths; and making dynamic timing analysis of the undecided paths.

With this timing analysis method, the maximum capacitance and minimum capacitance are determined for each node on a circuit. Static timing analysis is first made using the maximum capacitance and minimum capacitance to classify paths into conformable paths that satisfy a setup constraint, nonconformable paths that do not satisfy the constraint, and undecided paths that belong to neither the conformable paths nor the nonconformable paths. Dynamic timing analysis is then made of the undecided paths to allow them to fall into either conformable paths or nonconformable paths. The use of the dynamic timing analysis only for the paths that cannot be distinguished by the static timing analysis allows the time required for timing analysis to be reduced and precision analysis to be made.

According to a fifth aspect of the present invention, there is provided a timing analysis method for semiconductor integrated circuits comprising the steps of: determining maximum capacitance and minimum capacitance for each of nodes on a circuit; making first static timing analysis of data nodes that carry data signals and clock nodes that carry clock signals with the maximum capacitance selected for the data nodes and the minimum capacitance selected for the clock nodes; making second static timing analysis of the data nodes and the clock nodes with the minimum capacitance selected for the data nodes and the maximum capacitance selected for the clock nodes; classifying paths comprising one or more of the nodes on the circuit into nonconformable paths that, as the result of the first static timing analysis, do not satisfy a hold constraint, conformable paths that, as the result of the second static timing analysis, satisfy the hold constraint, and undecided paths that belong to neither the nonconformable paths nor the conformable paths; and making dynamic timing analysis of the undecided paths.

With this timing analysis method, the maximum capacitance and minimum capacitance are determined for each node on a circuit. Static timing analysis is first made using the maximum capacitance and minimum capacitance to classify paths into conformable paths that satisfy a hold constraint, nonconformable paths that do not satisfy the constraint, and undecided paths that belong to neither the conformable paths nor the nonconformable paths. Dynamic timing analysis is then made of the undecided paths to allow them to fall into either conformable paths or nonconformable paths. The use of the dynamic timing analysis only for the paths that cannot be distinguished by the static timing analysis allows the time required for timing analysis to be reduced and precision analysis to be made.

According to a sixth aspect of the present invention, there is provided a timing analysis method for semiconductor integrated circuits comprising the steps of: determining coupling capacitance and ground capacitance for each of nodes on a circuit; determining the ratio of the coupling capacitance to the total capacitance of the coupling capacitance and the ground capacitance (coupling capacitance/total capacitance) for each of the nodes; classifying the nodes into a first group of nodes for which the ratio of the coupling capacitance is greater than a preset value and a second group of nodes for which the ratio of the coupling capacitance is not greater than the preset value; determining maximum capacitance and minimum capacitance for each of the nodes in the first group; determining maximum capacitance and minimum capacitance for each of the nodes in the second group; making first static timing analysis of data nodes that carry data signals and clock nodes that carry clock signals with the maximum capacitance that has been determined for either the first group or the second group of nodes selected for the data nodes and the minimum capacitance that has been determined for either the first group or the second group of nodes selected for the clock nodes; making second static timing analysis of the data nodes and the clock nodes with the minimum capacitance that has been determined for either the first group or the second group of nodes selected for the data nodes and the maximum capacitance that has been determined for either the first group or the second group of nodes selected for the clock nodes; classifying paths comprising one or more of the nodes on the circuit into conformable paths that, as the result of the first static timing analysis, satisfy a setup constraint, nonconformable paths that, as the result of the second static timing analysis, do not satisfy the setup constraint, and undecided paths that belong to neither the conformable paths nor the nonconformable paths; and making dynamic timing analysis of the undecided paths.

With this timing analysis method, the coupling capacitance and ground capacitance are determined for each node on a circuit. Static timing analysis is first made using the coupling capacitance and ground capacitance to classify paths into conformable paths that satisfy a setup constraint, nonconformable paths that do not satisfy the constraint, and undecided paths that belong to neither the conformable paths nor the nonconformable paths. Dynamic timing analysis is then made of the undecided paths to allow them to fall into either conformable paths or nonconformable paths. The use of the dynamic timing analysis only for the paths that cannot be distinguished by the static timing analysis allows the time required for timing analysis to be reduced and precision analysis to be made.

According to a seventh aspect of the present invention, there is provided a timing analysis method for semiconductor integrated circuits comprising the steps of: determining coupling capacitance and ground capacitance for each of nodes on a circuit; determining the ratio of the coupling capacitance to the total capacitance of the coupling capacitance and the ground capacitance for each of the nodes; classifying the nodes into a first group of nodes for which the ratio of the coupling capacitance is greater than a preset value and a second group of nodes for which the ratio of the coupling capacitance is not greater than the preset value; determining maximum capacitance and minimum capacitance for each of the nodes in the first group; determining maximum capacitance and minimum capacitance for each of the nodes in the second group; making first static timing analysis of data nodes that carry data signals and clock nodes that carry clock signals with the maximum capacitance that has been determined for either the first group or the second group of nodes selected for the data nodes and the minimum capacitance that has been determined for either the first group or the second group of nodes selected for the clock nodes; making second static timing analysis of the data nodes and the clock nodes with the minimum capacitance that has been determined for either the first group or the second group of nodes selected for the data nodes and the maximum capacitance that has been determined for either the first group or the second group of nodes selected for the clock nodes; classifying paths comprising one or more of the nodes on the circuit into nonconformable paths that, as the result of the first static timing analysis, do not satisfy a hold constraint, conformable paths that, as the result of the second static timing analysis, satisfy the hold constraint, and undecided paths that belong to neither the nonconformable paths nor the conformable paths; and making dynamic timing analysis of the undecided paths.

With this timing analysis method, the coupling capacitance and ground capacitance are determined for each node on a circuit. Static timing analysis is first made using the coupling capacitance and ground capacitance to classify paths into conformable paths that satisfy a hold constraint, nonconformable paths that do not satisfy the constraint, and undecided paths that belong to neither the conformable paths nor the nonconformable paths. Dynamic timing analysis is then made of the undecided paths to allow them to fall into either conformable paths or nonconformable paths. The use of the dynamic timing analysis only for the paths that cannot be distinguished by the static timing analysis allows the time required for timing analysis to be reduced and precision analysis to be made.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

First Embodiment

First, a timing analysis method for semiconductor integrated circuits according to a first embodiment of the present invention will be described. This embodiment is directed to a timing analysis method for a setup constraint.

Figure 8:
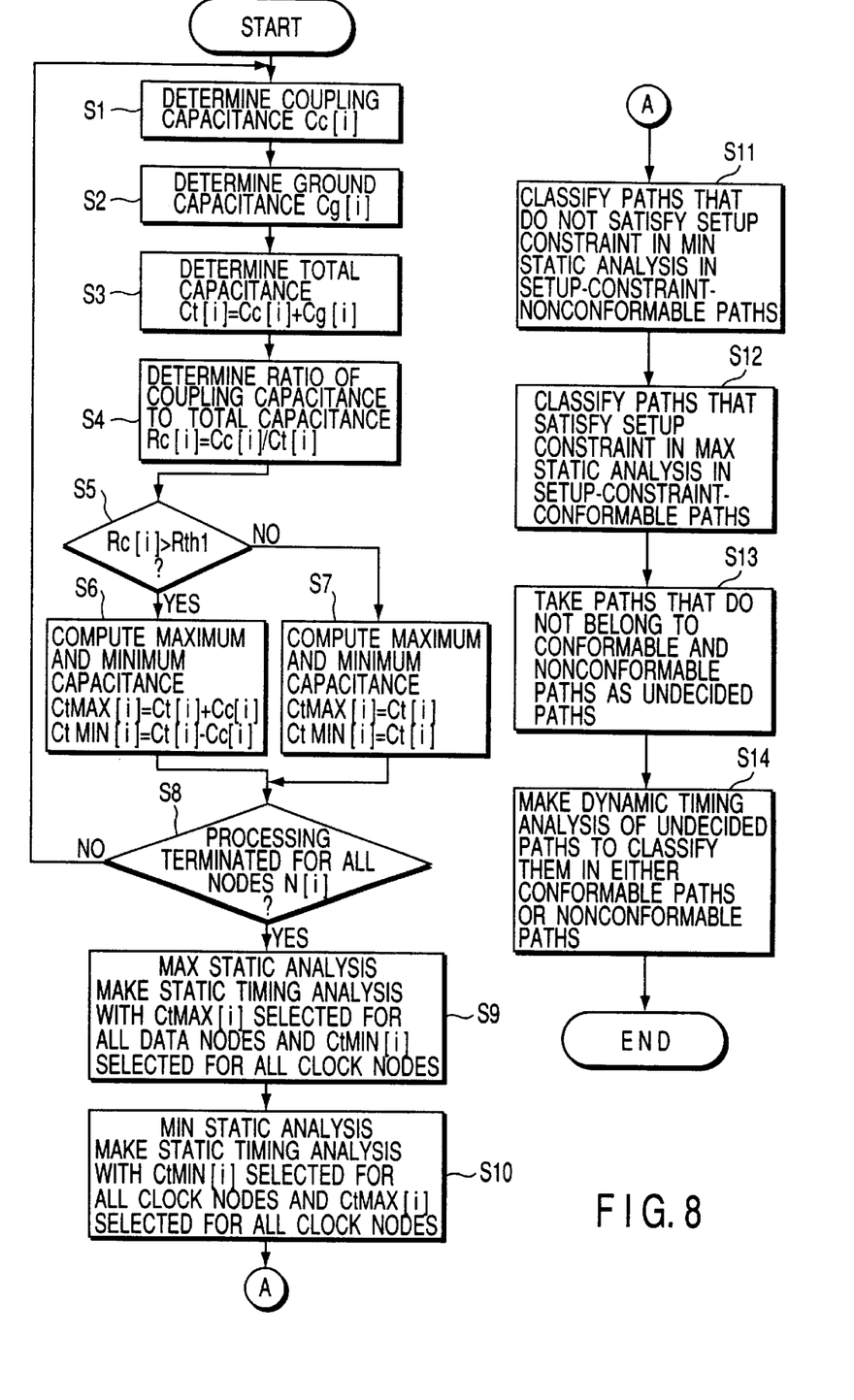
FIG. 8 is a flowchart for the timing analysis procedure according to a first embodiment of the present invention.
Figure 9:
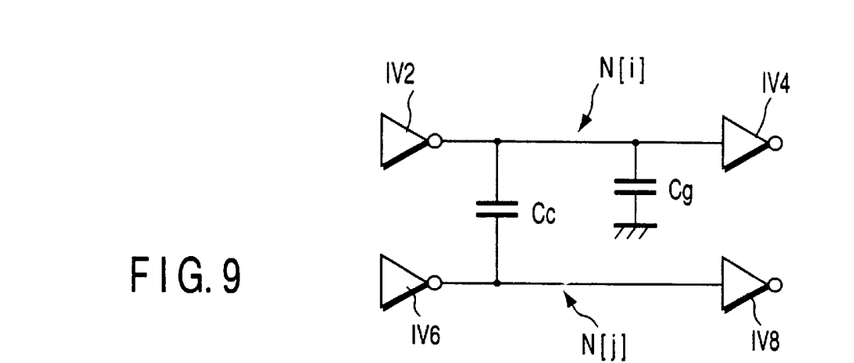
FIG. 9 is a circuit diagram illustrating interconnection capacitance between devices.

FIG. 8 is a flowchart for the timing analysis procedure of the first embodiment. FIG. 9 shows interconnection capacitances.

First, in the circuit of FIG. 9, a node $N[i]$ that interconnects inverters IV2 and IV4 and a node $N[j]$ that interconnects inverters IV6 and IV8 are formed in close proximity to each other. In this case, coupling capacitance Cc is formed between the nodes $N[i]$ and $N[j]$. In addition, ground capacitance Cg is formed between the node $N[i]$ and ground. Here, i and j are each a natural number (i=1, 2, 3, ..., n, j=1, 2, 3, ..., n) and represent node numbers allocated to individual nodes. Timing analysis is carried out on such a circuit in accordance with the following procedure.

First, the sum $Cc[i]$ of coupling capacitances associated with the object node $N[i]$ which is an object of timing analysis is determined (step S1). Then, the ground capacitance $Cg[i]$ of the object node $N[i]$ is determined (step S2). Subsequently, the total capacitance $Ct[i]$ of the coupling capacitance $Cc[i]$ and the ground capacitance $Cg[i]$ is determined (step S3).

$$Ct[i]=Cc[i]+cg[i]$$

Figure 10:
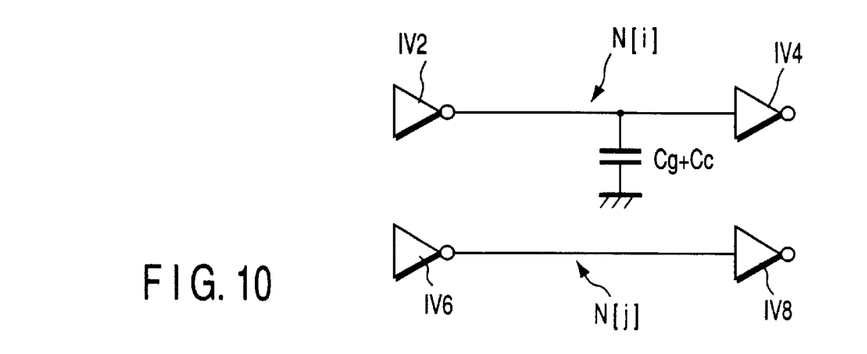
FIG. 10 shows an equivalent circuit illustrating interconnection capacitance when coupling capacitance is transformed to ground capacitance.
Figure 11:
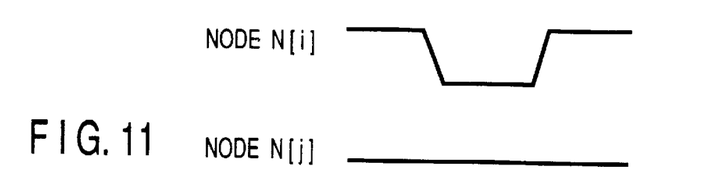
FIG. 11 is a timing diagram illustrating variations in the potential at the nodes in FIG. 10.

The total capacitance $Ct[i]$ corresponds to the case where the coupling capacitance is added to the ground capacitance as shown in FIG. 10 (i.e., transformation of the coupling capacitance to ground capacitance). This case supposes that the potential at the other node $N[j]$ is fixed as shown in FIG. 11. FIG. 10 is an equivalent circuit indicating interconnection capacitance when the coupling capacitance Cc is transformed to the ground capacitance Cg.

Subsequently, the ratio $Rc[i]$ of the coupling capacitance $Cc[i]$ to the total capacitance $Ct[i]$, which is defined by $$Rc[i]=Cc[i]/Ct[i]$$

is determined for each node (step S4).

Next, a given threshold Rth1 is set up on the ratio of the coupling capacitance and nodes are selected that satisfy the following condition (step S5).

$$Rc[i]>Rth1$$

The threshold Rth1 is determined by rules of thumb and may be even 0. Here, the nodes are classified into nodes that are large in coupling capacitance and nodes that are small in coupling capacitance.

For the nodes selected in step S5, the following maximum capacitance $CtMAX[i]$ and minimum capacitance $CtMIN[i]$ are calculated (step S6).

$$CtMAX[i]=Ct[i]+Cc[i]$$

$$CtMIN[i]=Ct[i]-Cc[i]$$

Figure 12:
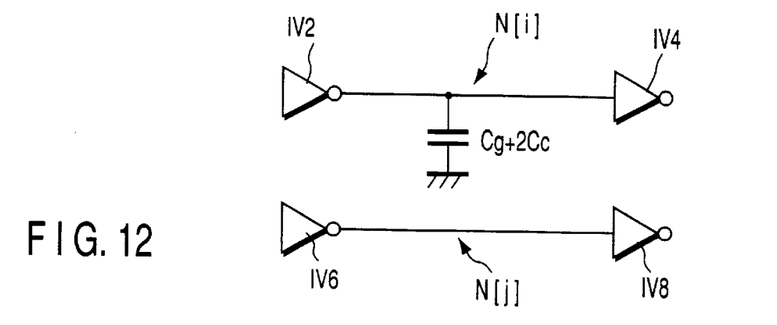
FIG. 12 shows an equivalent circuit illustrating interconnection capacitance when coupling capacitance is doubled and then transformed to ground capacitance.
Figure 13:
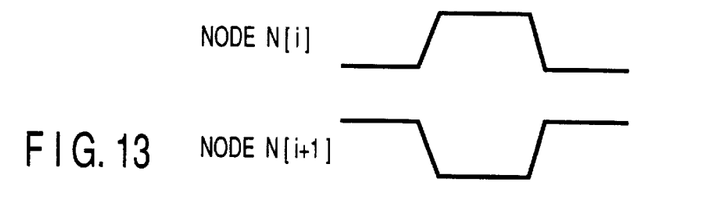
FIG. 13 is a timing diagram illustrating variations in the potential at the nodes in FIG. 12.

The maximum capacitance $CtMAX[i]$ corresponds to the case where the coupling capacitance Cc is doubled and then transformed to ground capacitance as shown in FIG. 12. This supposes that, as shown in FIG. 13, the potential at the other node $N[j]$ varies (rises or falls) in the opposite direction to and exactly simultaneously with the potential at the object node $N[i]$. As described previously, FIG. 12 shows an equivalent circuit indicating interconnection capacitance when the coupling capacitance Cc is doubled and then transformed to ground capacitance.

Figure 14:
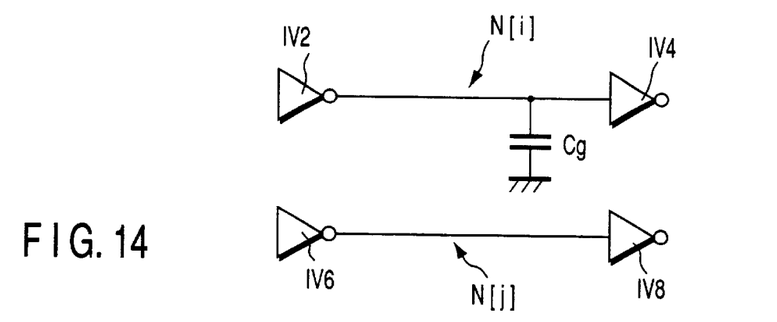
FIG. 14 shows an equivalent circuit illustrating interconnection capacitance when coupling capacitance is neglected.
Figure 15:
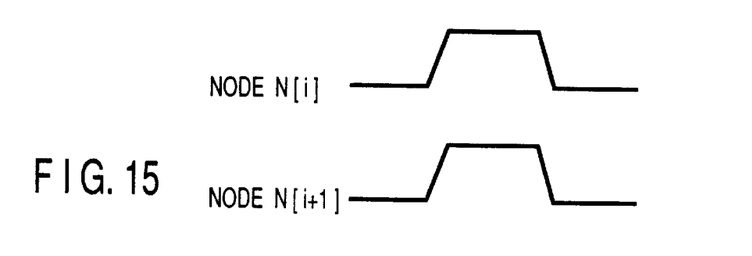
FIG. 15 is a timing diagram illustrating variations in the potential at the nodes in FIG. 14.

The minimum capacitance $CtMIN[i]$ corresponds to the case where the coupling capacitance is neglected as shown in FIG. 14. This supposes that, as shown in FIG. 15, the potential at the other node $N[j]$ varies (rises or falls) in the same direction as and exactly simultaneously with the potential at the object node $N[i]$. As described previously, FIG. 14 shows an equivalent circuit indicating interconnection capacitance when the coupling capacitance is neglected.

For all the nodes that have not been selected in step S5, the maximum capacitance and the minimum capacitance are set (step S7) such that $$CtMAX[i]=CtMIN[i]=Ct[i]$$

Next, a decision is made as to whether processing has been performed on all the object nodes $N[i]$, that is, the maximum capacitance $CtMAX[i]$ and the minimum capacitance $CtMIN[i]$ have been calculated for all the nodes $N[i]$ (step S8). In step S8, the maximum capacitance and minimum capacitance of each node are determined. If there is at least one object node unprocessed, then the process from step S1 to S8 is repeated for the next object node $N[i+1]$. If, on the other hand, there is no object node to be processed, then the process goes to step S9.

Next, the maximum capacitance $CtMAX[i]$ is selected for all the data nodes that carry data signals, and the minimum capacitance $CtMIN[i]$ is selected for all the clock nodes that carry clock signals. A static timing analysis is made of these data nodes and clock nodes (step S9). The static timing analysis is made with the normally used equipment and method. Here, the choice of the maximum capacitance for each data node allows static timing analysis that makes allowance for maximum delays to be made of data signals. For each clock node, the minimum capacitance is selected to allow static timing analysis that makes allowance for minimum delays to be made of clock signals. This means that the conformity of paths to the setup constraint in step S9 is checked under the most stringent conditions.

Next, the minimum capacitance $CtMIN[i]$ is selected for all the data nodes that carry data signals, and the maximum capacitance $CtMAX[i]$ is selected for all the clock nodes that carry clock signals. A static timing analysis is made of these data nodes and clock nodes (step S10). Likewise, this static timing analysis is made with normal equipment and method. Here, the choice of the minimum capacitance for each data node allows static timing analysis that makes allowance for minimum delays to be made of data signals. For each clock node, the maximum capacitance is selected to allow static timing analysis that makes allowance for maximum delays to be made of clock signals. This means that the conformity of paths to the setup constraint in step S10 is checked under the easiest conditions.

Next, on the basis of the results of steps S9 and S10, paths which are objects of verification and comprise one or more of the data nodes are classified into the following three categories (1) to (3).

Paths that are found by the static timing analysis for the minimum capacitance CtMIN[i] in step S10 to be nonconformable with the setup constraint are taken as setup constraint-nonconformable paths (1) (step S11).

Other Paths than the setup constraint-nonconformable paths (1) which are found by the static timing analysis for the maximum capacitance CtMAX in step S9 to be conformable to the setup constraint are taken as setup constraint-conformable paths (2) (step S12).

Other paths than the setup constraint-nonconformable paths (1) and the setup constraint-conformable paths (2) are taken as undecided paths (3) (step S13).

As for the undecided paths (3), only object paths are extracted as a circuit diagram and then dynamic timing analysis that allows for the coupling capacitance is made to determine whether they are nonconformable to the setup constraint (step S14). The dynamic timing analysis in step S14 allows the undecided paths to fall into either the setup constraint-nonconformable paths or the setup constraint-conformable paths (step S14). All the paths are thus classified into the setup constraint-nonconformable paths and the setup constraint-conformable paths.

Here, a description is made of differences between the static timing analysis and the dynamic timing analysis. In general, the static timing analysis calculates, on analysis of a specific path, only time variations in the potential at a node present on that path. Thus, timing analysis which makes allowance for coupling capacitance between that node and a node present on another path cannot be made. For this reason, it is difficult to make precise analysis. However, the analysis allows the required time to be proportional to the number of nodes.

On the other hand, the dynamic timing analysis calculates time variations in the potential at all the nodes and thus can make timing analysis that allows for node-to-node coupling capacitance. For this reason, precise analysis can be made. However, the analysis requires a time proportional to a power of the number of nodes.

With the timing analysis shown in FIG. 8, the fast static timing analysis is first made to divide object paths into conformable paths, nonconformable paths, and undecided paths. After that, the precise dynamic timing analysis is made to allow the undecided paths fall into either conformable paths or nonconformable paths. Thereby, the time required for timing analysis can be reduced and precise analysis can be made.

Such timing analysis for semiconductor integrated circuits allows the effect of coupling capacitance to be reflected precisely and a margin requirement is also eliminated. Further, if the timing analysis shows that the constraint is satisfied, then it is guaranteed that it will be satisfied even on actual chips.

According to the first embodiment, as described above, the time required for timing analysis can be reduced and precision analysis can be made by using the dynamic timing analysis only for paths that cannot be distinguished by the static timing analysis. That is, the first embodiment allows precision timing analysis to be made in a short period of time.

Second Embodiment

Next, a timing analysis method for semiconductor integrated circuits according to a second embodiment of the present invention will be described. The second embodiment is directed to a timing analysis method for a hold constraint.

Figure 16:
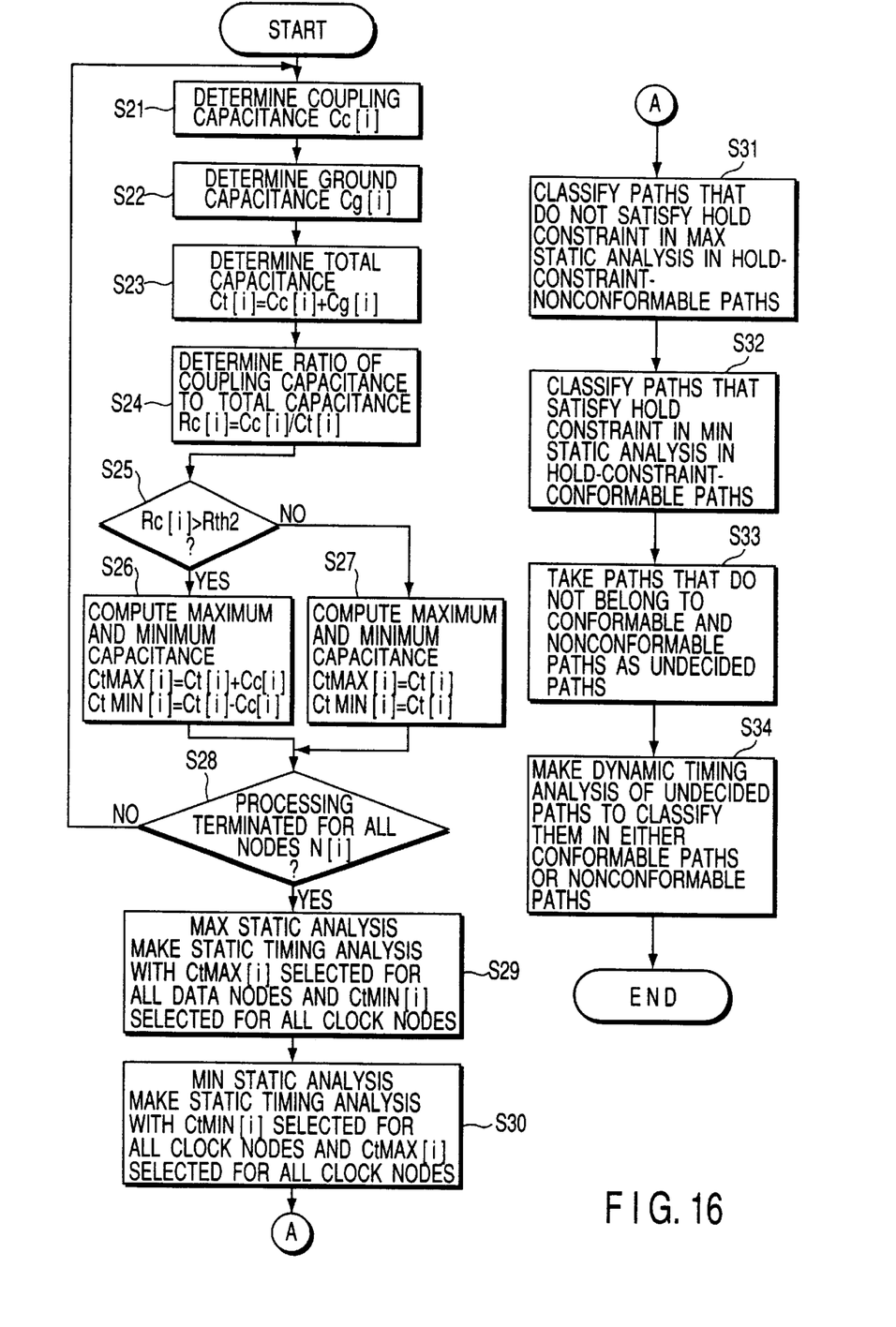
FIG. 16 is a flowchart for the timing analysis procedure according to a second embodiment of the present invention.

FIG. 16 is a flowchart for the timing analysis procedure of the second embodiment. As with the first embodiment, timing analysis is made of the circuit shown in FIG. 9 in accordance with the following procedure.

First, the sum Cc[i] of the coupling capacitances of the node N[i] which is an object of timing analysis is determined (step S21). Then, the ground capacitance Cg[i] of the object node N[i] is determined (step S22). Subsequently, the total capacitance Ct[i] of the coupling capacitance Cc[i] and the ground capacitance Cg[i] is determined (step S23).

$$Ct[i]=Cc[i]+cg[i]$$

The total capacitance Ct[i] corresponds to the case where the coupling capacitance is transformed to the ground capacitance as shown in FIG. 10. This case supposes that the potential at the other node N[i+1] is fixed as shown in FIG. 11. FIG. 10 is an equivalent circuit indicating interconnection capacitance when the coupling capacitance Cc is transformed to the ground capacitance Cg.

Subsequently, the ratio Rc[i] of the coupling capacitance Cc[i] to the total capacitance Ct[i], which is defined by $$Rc[i]=Cc[i]/Ct[i]$$

is determined for each node (step S24).

Next, a given threshold Rth2 is set up on the ratio of the coupling capacitance and nodes are selected that satisfy the following condition (step 25).

$$Rc[i]>Rth2$$

The threshold Rth2 is determined by rules of thumb and may be even 0. Here, the nodes are classified into nodes that are large in coupling capacitance and nodes that are small in coupling capacitance For the nodes selected in step S25, the following maximum capacitance CtMAX[i] and minimum capacitance CtMIN[i] are calculated (step S26).

$$CtMAX[i]=Ct[i]+Cc[i]$$

$$CtMIN[i]=Ct[i]-Cc[i]$$

The maximum capacitance CtMAX[i] corresponds to the case where the coupling capacitance Cc is doubled and then transformed to ground capacitance as shown in FIG. 12. This supposes that, as shown in FIG. 13, the potential at the other node N[j] varies (rises or falls) in the opposite direction to and exactly simultaneously with the potential at the object node N[i]. As described previously, FIG. 12 shows an equivalent circuit indicating interconnection capacitance when the coupling capacitance Cc is doubled and then transformed to ground capacitance.

The minimum capacitance CtMIN[i] corresponds to the case where the coupling capacitance is neglected as shown in FIG. 14. This supposes that, as shown in FIG. 15, the potential at the other node N[j] varies (rises or falls) in the same direction as and exactly simultaneously with the potential at the object node N[i]. As described previously, FIG. 14 shows an equivalent circuit indicating interconnection capacitance when the coupling capacitance is neglected.

For all the nodes that have not been selected in step S25, the maximum capacitance and the minimum capacitance are set (step S27) such that $$CtMAX[i]=CtMIN[i]=Ct[i]$$

Next, a decision is made as to whether processing has been performed on all the object nodes N[i], that is, the maximum capacitance CtMAX[i] and the minimum capacitance CtMIN[i] have been calculated for all the nodes N[i] (step S28). In step S28, the maximum capacitance and minimum capacitance of each node are determined. If there is at least one object node unprocessed, then the process from step S1 to S8 is repeated for the next object node N[i+1]. If, on the other hand, there is no object node to be processed, then the process goes to step S29.

Next, the maximum capacitance CtMAX[i] is selected for all the data nodes that carry data signals, and the minimum capacitance CtMIN[i] is selected for all the clock nodes that carry clock signals. A static timing analysis is made of these data nodes and clock nodes (step S29). The static timing analysis is made with the normal equipment and method. Here, the choice of the maximum capacitance for each data node allows static timing analysis that makes allowance for maximum delays to be made of data signals. For each clock node, the minimum capacitance is selected to allow static timing analysis that makes allowance for minimum delays to be made of clock signals. This means that the conformity of paths to the hold constraint in step S29 is checked under the easiest conditions.

Next, the minimum capacitance CtMIN[i] is selected for all the data nodes that carry data signals, and the maximum capacitance CtMAX[i] is selected for all the clock nodes that carry clock signals. A static timing analysis is made of these data nodes and clock nodes (step S30). Likewise, this static timing analysis is made with the normal equipment and method. Here, the choice of the minimum capacitance for each data node allows static timing analysis that makes allowance for minimum delays to be made of data signals. For each clock node, the maximum capacitance is selected to allow static timing analysis that makes allowance for maximum delays to be made of clock signals. This means that the conformity of paths to the hold constraint in step S30 is checked under the most stringent conditions.

Next, on the basis of the results of steps S29 and S30, paths which are objects of verification and comprise one or more of the data nodes are classified into the following three categories (1) to (3).

Paths that are found by the static timing analysis for the maximum capacitance CtMAX[i] in step S29 to be nonconformable with the hold constraint are taken as hold constraint-nonconformable paths (1) (step S31).

Other paths than the hold constraint-nonconformable paths (1) which are found by the static timing analysis for the minimum capacitance CtMIX in step S30 to be conformable to the hold constraint are taken as hold constraint-conformable paths (2) (step S32).

Other paths than the hold constraint-nonconformable paths (1) and the hold constraint-conformable paths (2) are taken as undecided paths (3) (step S33).

As for the undecided paths (3), only object paths are extracted as a circuit diagram and then dynamic timing analysis that allows for the coupling capacitance is made to determine whether they are nonconformable to the hold constraint (step S34). The dynamic timing analysis in step S34 allows the undecided paths to fall into either the hold constraint-nonconformable paths or the hold constraint-conformable paths (step S34). All the paths to be verified become thus classified into the hold constraint-nonconformable paths and the hold constraint-conformable paths.

With the timing analysis shown in FIG. 16, as in the first embodiment, the fast static timing analysis is first made to divide object paths into conformable paths, nonconformable paths, and undecided paths. After that, the precise dynamic timing analysis is made to allow the undecided paths to fall into either conformable paths or nonconformable paths. Thereby, the time required for timing analysis can be reduced and precise analysis can be made.

The use of such timing analysis for semiconductor integrated circuits allows the effect of coupling capacitance to be reflected precisely and a margin requirement is also eliminated. Further, if the timing analysis shows that the constraint is satisfied, then it is guaranteed that it is satisfied even on actual chips.

According to the second embodiment, as described above, the time required for timing analysis can be reduced and precision analysis can be made by using the dynamic timing analysis only for paths that cannot be distinguished by the static timing analysis. That is, the second embodiment allows precision timing analysis to be made in a short period of time.

Thus, the present invention provides a fast, precision timing analysis method which allows the effects of coupling capacitance between interconnections to be reflected accurately.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A timing analysis method for semiconductor integrated circuits comprising the steps of:

determining maximum capacitance and minimum capacitance for each of nodes on a circuit, the maximum capacitance being the sum of ground capacitance and twice coupling capacitance, the minimum capacitance being the ground capacitance;

making static timing analysis, using the maximum capacitance and minimum capacitance, of paths comprising one or more of the nodes on the circuit to classify the paths into conformable paths that satisfy a constraint with regard to timing of clock signals and data signals, nonconformable paths that do not satisfy the constraint, and undecided paths that belong to neither the conformable paths nor the nonconformable paths; and making dynamic timing analysis of the undecided paths.

2. A timing analysis method according to claim 1, wherein the constraint is a setup constraint.

3. A timing analysis method according to claim 1, wherein the constraint is a hold constraint.

4. A timing analysis method for semiconductor integrated circuits comprising the steps of:

determining maximum capacitance and minimum capacitance for each of nodes on a circuit, the maximum capacitance being the sum of ground capacitance and twice coupling capacitance, the minimum capacitance being the ground capacitance;

making static timing analysis of data nodes that carry data signals and clock nodes that carry clock signals with the maximum capacitance selected for the data nodes and the minimum capacitance selected for the clock nodes;

classifying, on the basis of the result of the static timing analysis, paths comprising one or more of the nodes on the circuit into conformable paths that satisfy a setup constraint and undecided paths that do not belong to the conformable paths; and making dynamic timing analysis of the undecided paths.

5. A timing analysis method for semiconductor integrated circuits comprising the steps of:

determining maximum capacitance and minimum capacitance for each of nodes on a circuit, the maximum capacitance being the sum of ground capacitance and twice coupling capacitance, the minimum capacitance being the ground capacitance;

making static timing analysis of data nodes that carry data signals and clock nodes that carry clock signals with the minimum capacitance selected for the data nodes and the maximum capacitance selected for the clock nodes;

classifying, on the basis of the result of the static timing analysis, paths comprising one or more of the nodes on the circuit into conformable paths that satisfy a hold constraint and undecided paths that do not belong to the conformable paths; and making dynamic timing analysis of the undecided paths.

6. A timing analysis method for semiconductor integrated circuits comprising the steps of:

determining maximum capacitance and minimum capacitance for each of nodes on a circuit, the maximum capacitance being the sum of ground capacitance and twice coupling capacitance, the minimum capacitance being the ground capacitance;

making first static timing analysis of data nodes that carry data signals and clock nodes that carry clock signals with the maximum capacitance selected for the data nodes and the minimum capacitance selected for the clock nodes;

making second static timing analysis of the data nodes and the clock nodes with the minimum capacitance selected for the data nodes and the maximum capacitance selected for the clock nodes;

classifying paths comprising one or more of the nodes on the circuit into conformable paths that, as the result of the first static timing analysis, satisfy a setup constraint, nonconformable paths that, as the result of the second static timing analysis, do not satisfy the setup constraint, and undecided paths that belong to neither the conformable paths nor the nonconformable paths; and making dynamic timing analysis of the undecided paths.

7. A timing analysis method for semiconductor integrated circuits comprising the steps of:

determining maximum capacitance and minimum capacitance for each of nodes on a circuit, the maximum capacitance being the sum of ground capacitance and twice coupling capacitance, the minimum capacitance being the ground capacitance;

making first static timing analysis of data nodes that carry data signals and clock nodes that carry clock signals with the maximum capacitance selected for the data nodes and the minimum capacitance selected for the clock nodes;

making second static timing analysis of the data nodes and the clock nodes with the minimum capacitance selected for the data nodes and the maximum capacitance selected for the clock nodes;

classifying paths comprising one or more of the nodes on the circuit into nonconformable paths that, as the result of the first static timing analysis, do not satisfy a hold constraint, conformable paths that, as the result of the second static timing analysis, satisfy the hold constraint, and undecided paths that belong to neither the nonconformable paths nor the conformable paths; and making dynamic timing analysis of the undecided paths.

8. A timing analysis method for semiconductor integrated circuits comprising the steps of:

determining coupling capacitance and ground capacitance for each of nodes on a circuit;

determining the ratio of the coupling capacitance to the total capacitance of the coupling capacitance and the ground capacitance (coupling capacitance/total capacitance) for each of the nodes;

classifying the nodes into a first group of nodes for which the ratio of the coupling capacitance is greater than a preset value and a second group of nodes for which the ratio of the coupling capacitance is not greater than the preset value;

determining maximum capacitance and minimum capacitance for each of the nodes in the first group, the maximum capacitance determined for the first group of nodes being the sum of the ground capacitance and twice the coupling capacitance, the minimum capacitance determined for the first group of nodes being the ground capacitance;

determining maximum capacitance and minimum capacitance for each of the nodes in the second group, the maximum capacitance and the minimum capacitance determined for the second group of nodes being the sum of the ground capacitance and the coupling capacitance;

making first static timing analysis of data nodes that carry data signals and clock nodes that carry clock signals with the maximum capacitance that has been determined for either the first group or the second group of nodes selected for the data nodes and the minimum capacitance that has been determined for either the first group or the second group of nodes selected for the clock nodes;

making second static timing analysis of the data nodes and the clock nodes with the minimum capacitance that has been determined for either the first group or the second group of nodes selected for the data nodes and the maximum capacitance that has been determined for either the first group or the second group of nodes selected for the clock nodes;

classifying paths comprising one or more of the nodes on the circuit into conformable paths that, as the result of the first static timing analysis, satisfy a setup constraint, nonconformable paths that, as the result of the second static timing analysis, do not satisfy the setup constraint, and undecided paths that belong to neither the conformable paths nor the nonconformable paths; and making dynamic timing analysis of the undecided paths.

9. A timing analysis method according to claim 8, wherein the preset value is set to 0, and all the nodes are taken as the first group without classifying the nodes according to the ratio of the coupling capacitance to the total capacitance.

10. A timing analysis method for semiconductor integrated circuits comprising the steps of:

determining coupling capacitance and ground capacitance for each of nodes on a circuit;

determining the ratio of the coupling capacitance to the total capacitance of the coupling capacitance and the ground capacitance for each of the nodes;

classifying the nodes into a first group of nodes for which the ratio of the coupling capacitance is greater than a preset value and a second group of nodes for which the ratio of the coupling capacitance is not greater than the preset value;

determining maximum capacitance and minimum capacitance for each of the nodes in the first group, the maximum capacitance determined for the first group of nodes being the sum of the ground capacitance and twice the coupling capacitance, the minimum capacitance determined for the first group of nodes being the ground capacitance;

determining maximum capacitance and minimum capacitance for each of the nodes in the second group, the maximum capacitance and the minimum capacitance determined for the second group of nodes being the sum of the ground capacitance and the coupling capacitance;

making first static timing analysis of data nodes that carry data signals and clock nodes that carry clock signals with the maximum capacitance that has been determined for either the first group or the second group of nodes selected for the data nodes and the minimum capacitance that has been determined for either the first group or the second group of nodes selected for the clock nodes;

making second static timing analysis of the data nodes and the clock nodes with the minimum capacitance that has been determined for either the first group or the second group of nodes selected for the data nodes and the maximum capacitance that has been determined for either the first group or the second group of nodes selected for the clock nodes;

classifying paths comprising one or more of the nodes on the circuit into nonconformable paths that, as the result of the first static timing analysis, do not satisfy a hold constraint, conformable paths that, as the result of the second static timing analysis, satisfy the hold constraint, and undecided paths that belong to neither the nonconformable paths nor the conformable paths; and making dynamic timing analysis of the undecided paths.

11. A timing analysis method according to claim 10, wherein the preset value is set to 0, and all the nodes are taken as the first group without classifying the nodes according to the ratio of the coupling capacitance to the total capacitance.

* * * * *